United States Patent [19]

Kubosawa et al.

[11] Patent Number: 4,851,891
[45] Date of Patent: Jul. 25, 1989

[54] GATE ARRAY HAVING TRANSISTOR BURIED IN INTERCONNECTION REGION

[75] Inventors: Hajime Kubosawa, Machida; Mitsugu Naitoh, Kawasaki, both of Japan

[73] Assignee: Fujitsu Limited, Kawasaki, Japan

[21] Appl. No.: 154,104

[22] Filed: Feb. 9, 1988

[30] Foreign Application Priority Data

Feb. 9, 1987 [JP] Japan .................................. 62-27785
Sep. 17, 1987 [JP] Japan .................................. 62-233022

[51] Int. Cl.⁴ .......................................... H01L 27/04
[52] U.S. Cl. .......................................... 357/42; 357/45
[58] Field of Search .................................... 357/42, 45

[56] References Cited

U.S. PATENT DOCUMENTS 4,668,972 5/1987 Sato et al. .............................. 357/45
4,692,783 9/1987 Monma et al. .......................... 357/45

FOREIGN PATENT DOCUMENTS 131463 1/1985 European Pat. Off. ......... 357/45 M
58-139446 8/1983 Japan ................................. 357/45 M

*Primary Examiner*—William D. Larkins
*Attorney, Agent, or Firm*—Staas & Halsey

[57] ABSTRACT

A gate array comprises a semiconductor substrate, a plurality of mutually parallel basic cell columns each made up of a plurality of basic cells formed on the semiconductor substrate, where each of the basic cells comprise a pair of first p-channel transistor and first n-channel transistor, a plurality of interconnection regions each formed between two mutually adjacent ones of the basic cell columns, and specific cells buried in one or a plurality of predetermined ones of the interconnection regions, where each of the specific cells comprise at least a second p-channel transistor and a second n-channel transistor which constitute a transmission gate.

17 Claims, 6 Drawing Sheets

GATE ARRAY HAVING TRANSISTOR BURIED IN INTERCONNECTION REGION

BACKGROUND OF THE INVENTION

The present invention generally relates to gate arrays, and more particularly to a gate array which effectively utilizes an interconnection (wiring) region.

The demand for the gate arrays is increasing due to the fact that the gate array can be used to develop a semi-customized semiconductor integrated circuit at a relatively low cost within a short time. At the same time, there are much demands on the gate array to realize multiple functions and high integration density. For this reason, there is a need to effectively utilize the interconnection region of the gate array.

FIG. 1 is a plan view generally showing a conventional gate array. The gate array comprises a chip (substrate) 10 which is constituted by a silicon wafer or the like, and basic cell columns 11 are arranged parallel to each other with predetermined intervals on the chip 10. Each basic cell column 11 is made up of a plurality of basic cells 14. Two mutually adjacent basic cell columns 11 are separated by an empty region of a predetermined width, that is, an interconnection region 12. The interconnection region 12 is primarily provided for the purpose of forming an interconnection wiring layer which connects the basic cell columns 11. A plurality of input-/output cells 13 are provided on a peripheral portion of the chip 10. The input/output cells 13 are provided to form an interface between a circuit formed within the chip 10 and an external circuit.

Each of the basic cells 14 constituting the basic cell column 11 may have a structure shown in FIG. 2. In FIG. 2, a basic cell 14A comprises two parallel gate electrodes 15 and 16 extending in a direction perpendicular to the basic cell column 11, and a p-type diffusion region 17 and an n-type diffusion region 18 for forming respective source regions and drain regions of p-channel transistors P1 and P2 and n-channel transistors N1 and N2 having the gate electrodes 15 and 16. Hence, a first transistor pair is made up of the p-channel transistor P1 and the n-channel transistor N1 having the gate electrode 51 in common, and a second transistor pair is made up of the p-channel transistor P2 and the n-channel transistor N2 having the gate electrode 52 in common. As shown in FIG. 2, each of the transistors P1, P2, N1 and N2 have a channel width W and a channel length L. In other words, a channel width-to-length ratio is W/L for each of the transistors P1, P2, N1 and N2.

In the conventional gate array shown in FIG. 1, the circuit on the chip 10 is constituted by the basic cells 14 having the structure shown in FIG. 2. For this reason, in a case where a driving capacity of the transistors constituting the basic cells 14 is too small, it is necessary to use a plurality of basic cells 14 so as to obtain equivalents of transistors having a large channel width-to-length ratio.

As one example of the case where the driving capacity of the transistors constituting the basic cells 14 is too small, there is a case where a bus driver is to be constituted by a transmission gate. The transmission gate functions as a switch for forming a connection and a disconnection between a bus line and a driver, and it is essential that a signal delay time is kept down to a minimum. For this reason, the channel width-to-length ratio of the transistors constituting the transmission gate is set to a sufficiently large value, so as to reduce the resistance when the transmission gate is turned ON. Normally, a channel width-to-length ratio which is two to three times that of the transistors constituting the basic cell 14A shown in FIG. 2 is required for the transistors constituting the transmission gate. As a result, a plurality of basic cells 14 are connected in parallel to constitute the transmission gate.

As will be described later, in a case where basic circuit blocks belonging to different basic cell columns 11 are connected by a bus line, a bus driver is provided between an output of the basic circuit block and the bus line. Generally, the bus driver comprises a driver circuit 25 and a transmission gate 26 as shown in FIG. 4, and the bus driver is provided between a basic circuit block 24 and a bus line 27. The transmission gate 26 is made up of a p-channel transistor $Q_p$ and an n-channel transistor $Q_n$. The transmission gate 26 is controlled to a conductive state and a non-conductive state depending on control signals CNT and $\overline{CNT}$ applied to respective gates of the transistors $Q_p$ and $Q_n$, thereby connecting and disconnecting the basic circuit block 24 to and from the bus line 27.

However, the transistors constituting the basic cell 14A shown in FIG. 2 have in common one of the gate region, the drain region and the source region. Consequently, predetermined transistors are ineffective and unused when the plurality of basic cells 14 are connected in parallel to constitute the transmission gate.

In other words, two driver circuits 25 can be made from one basic cell 14A, however, only one transmission gate 26 can be made from one basic cell 14A because the p-channel transistor $Q_p$ and the n-channel transistor $Q_n$ must have independent gates. Hence, if the p-channel transistor P1 and the n-channel transistor N2 shown in FIG. 2 were used to constitute the transmission gate 26, the p-channel transistor P2 and the n-channel transistor N1 are ineffective and unused.

Accordingly, in a circuit having a plurality of bus drivers built therein, there is a problem in that the deterioration in the utilization efficiency of the chip area due to the ineffective transistors cannot be neglected.

On the other hand, the structure of the basic cells 14 may be changed as shown in FIG. 3 so that the transmission gate may be constituted thereby. A basic cell 14B shown in FIG. 3 comprises a p-type source/drain region 20 which is formed by injecting impurities into the chip 10, an n-type source/drain region 21 formed by injecting impurities into the chip 10, and gate electrodes 22 formed on the source/drain regions 20 and 21 and extending in a direction perpendicular to the basic cell columns 11. Hence, the basic cell 14B comprises at least one pair of p-channel transistors and one pair of n-channel transistors.

In the example shown in FIG. 3, a pair of p-channel transistors are constituted by the p-type source/drain region 20 and two independent gate electrodes 22a and 22b of the gate electrodes 22, and a pair of n-channel transistors are constituted by the n-type source/drain region 21 and two independent gate electrodes 22c and 22d of the gate electrodes 22. In other words, first and second transistor pairs are formed, where each transistor pair is made up of a p-channel transistor and an n-channel transistor. In FIG. 3, CA denotes contact regions for supplying a predetermined voltage to the semiconductor substrate on which the transistors are formed or to a well.

Normally, the basic cells 14 within the same basic cell column 11 are used to form a basic circuit block constituted by logic circuits such as a NAND circuit and a NOR circuit. The basic circuit blocks belonging to different basic cell columns 11 are connected to form one integrated circuit on the chip 10. The interconnection for connecting the basic circuit blocks is formed in the interconnection region provided between the basic cell columns 11.

In a case where the basic circuit blocks belonging to different basic cell columns 11 are connected by a bus line, a bus driver is provided between an output of the basic circuit block and the bus line. Generally, the bus driver comprises the driver circuit 25 and the transmission gate 26 as described before in conjunction with FIG. 4, and the bus driver is provided between the basic circuit block 24 and the bus line 27.

When producing an integrated circuit by use of the normal gate array, the driver circuit 25 and the transmission gate 26 of the bus driver are constituted by the basic cells 14B shown in FIG. 3, for example, and FIG. 5 shows an example of the conceivable interconnection for forming the transmission gate 26 by the basic cells 14B. In FIG. 5, a bold solid line and a bold phantom line denote a lower interconnection L1 and an upper interconnection L2, respectively. The lower interconnection L1 connects through contact holes 30 to the p-type source/drain region 20, the n-type source/drain region 21, the gate electrodes 22 and the contact regions CA. On the other hand, the upper interconnection L2 connects to the lower interconnection L1 through through holes 31 formed in an insulating layer (not shown) provided between the upper and lower interconnections L2 and L1. The upper interconnection L2 constitutes leader lines for an input line IN and an output line OUT of the transmission gate 26. In FIG. 5, the contact holes 30 are indicated by circular marks, and the through holes 31 are shown as double circular marks.

Normally, the two p-channel transistors within the basic cell 14B are connected in parallel and the two n-channel transistors within the basic cell 14B are similarly connected in parallel as shown in FIG. 5, to thereby constitute the transmission gate 26.

The interconnections L1 and L2 are arranged on predetermined imaginary grids so as to automatically design the interconnection arrangement by the CAD technique. In FIG. 5, the basic cell 14B occupies grid numbers "1" to "10" running parallel to the basic cell column 11. The lower interconnection L1 is connected to the transistors within the basic cell 14B through the contact holes 30 arranged on these grids.

It is desirable that the through hole 31 provided for connecting the interconnections L1 and L2 is not located above the contact hole 30 provided for connecting the lower interconnection L1 to the transistors. For this reason, the through hole 31 is formed on a grid which is different from the grid on which the contact hole 30 is formed. In addition, an element isolation region amounting to approximately one grid interval is provided between the p-channel transistors and the n-channel transistors in FIG. 5.

Therefore, the following problems occur in the arrangement shown in FIG. 5.

Firstly, it is necessary to provide the interconnections in two levels, because the leader line (that is, the upper interconnection L2) for the input line IN and output line OUT of the transmission gate 26 intersects the lower interconnection L1 which makes internal connections within the basic cell 14B.

Secondly, the contact holes 30 and the through holes 31 are arranged parallel to the basic cell column 11 over a large distance of nine grid intervals in FIG. 5.

Thirdly, the lower interconnection L1 is arranged to make the internal connections within the basic cell 14B over a large distance of four grid intervals of the grids running perpendicularly to the basic cell column 11 in FIG. 5.

In other words, the number of grids over which the connections are made to constitute the transmission gate 26 is large, and consequently, a degree of freedom with which the interconnection may be designed to connect the basic circuit blocks is small. In addition, the necessity to provide the interconnections in two levels makes the process of forming the interconnection complex. Hence, it is desirable that the interconnection can be made over a small number of grids, and it is also desirable to avoid the interconnections in two levels.

SUMMARY OF THE INVENTION

Accordingly, it is a general object of the present invention to provide a novel and useful gate array in which the problems described heretofore are eliminated.

Another and more specific object of the present invention is to provide a gate array which comprises p-channel and n-channel transistors buried in one or a plurality of arbitrary interconnection regions, where the buried p-channel and n-channel transistors have a channel width-to-length ratio greater than that of p-channel and n-channel transistors constituting each of basic cells of the gate array. According to the gate array of the present invention, it is unnecessary to use a large number of the basic cells when constituting a transmission gate because the buried p-channel and n-channel transistors may be used to constitute the transmission gate. Therefore, the utilization efficiency of a chip area is improved according to the present invention.

Still another object of the present invention is to provide a gate array comprising a semiconductor substrate, a plurality of mutually parallel basic cell columns each made up of a plurality of basic cells formed on the semiconductor substrate, where each of the basic cells comprise a pair of first p-channel transistor and first n-channel transistor, a plurality of interconnection regions each formed between two mutually adjacent ones of the basic cell columns, and specific cells buried in one or a plurality of predetermined ones of the interconnection regions, where each of the specific cells comprise at least a second p-channel transistor and a second n-channel transistor which constitute a transmission gate. According to the gate array of the present invention, the utilization of the chip (substrate) area is improved.

A further object of the present invention is to provide a gate array in which the second p-channel transistor comprises a p-type source/drain region and a first gate electrode and the second n-channel transistor comprises an n-type source/drain region and a second gate electrode, and the p-type source/drain region and the n-type source/drain region generally confront each other in a central portion of the specific cell so that a large portion of the p-type source/drain region and a large portion of the n-type source/drain region are respectively sectioned by a center line of the specific cell running parallel to the basic cell columns. According to the gate array of the present invention, it is possible to simplify the process of producing an integrated circuit using the gate array.

Other objects and further features of the present invention will be apparent from the following detailed description when read in conjunction with the accompanying drawings.

DETAILED DESCRIPTION

Figure 6:
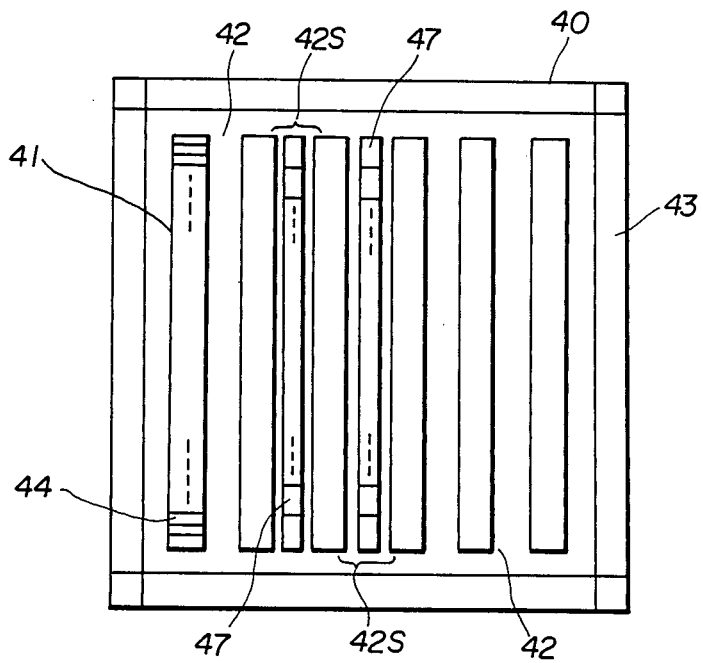
FIG. 6 is a plan view generally showing a first embodiment of the gate array according to the present invention.

First, a description will be given on a first embodiment of the gate array according to the present invention, by referring to FIG. 6. FIG. 6 shows a plan view of the first embodiment of the gate array. The gate array comprises a chip (substrate) 40 which is constituted by a silicon wafer or the like, and basic cell columns 41 are arranged parallel to each other with predetermined intervals on the chip 40. Each basic cell column 41 is made up of a plurality of basic cells 44. Two mutually adjacent basic cell columns 41 are separated by an empty region of a predetermined width, that is, an interconnection region 42. The interconnection region 42 is primarily provided for the purpose of forming an interconnection wiring layer which connect the basic cell columns 41. A plurality of input/output cells 43 are provided on a peripheral portion of the chip 40. The input/output cells 43 are provided to form an interface between a circuit formed within the chip 40 and an external circuit. In addition, specific cells 47 for forming the transmission gate and the like are buried in the chip 40 within predetermined one or a plurality of interconnection regions 42. In FIG. 6, there are two predetermined interconnection regions 42S having the buried specific cells 47.

Figure 7:
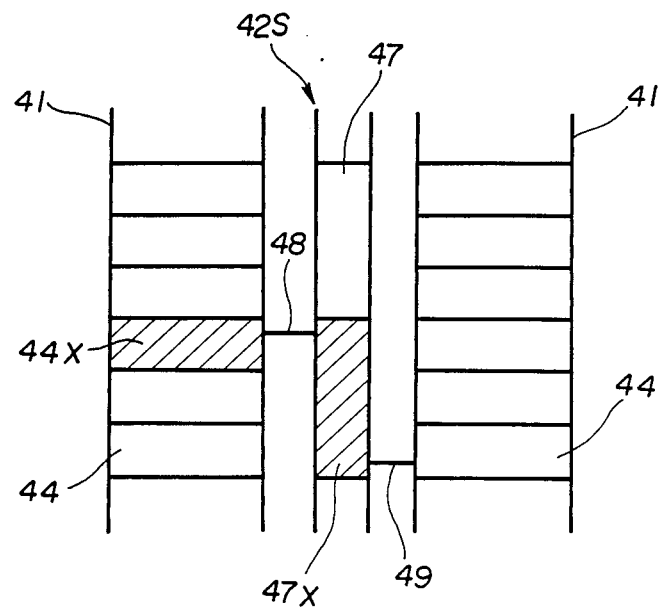
FIG. 7 is a plan view showing on a large scale a specific cell and portions of basic cell columns in vicinities thereof in the first embodiment.

FIG. 7 shows on a large scale the specific cell 47 and portions of the basic cell columns 41 in vicinities thereof. In FIG. 7, a predetermined specific cell 47X and a predetermined basic cell 44X of the basic cell column 41 which are connected by an interconnection 48 and constitute a bus driver are indicated by hatchings. As shown, the specific cells 47 (and 47X) have a shape elongated in a direction parallel to the basic cell column 41. On the other hand, an interconnection 49 connects the specific cell 47X indicated by the hatching and a basic cell 44 of the basic cell column 41 which is adjacent to the basic cell column 41 having the predetermined basic cell 44X.

Figure 1:
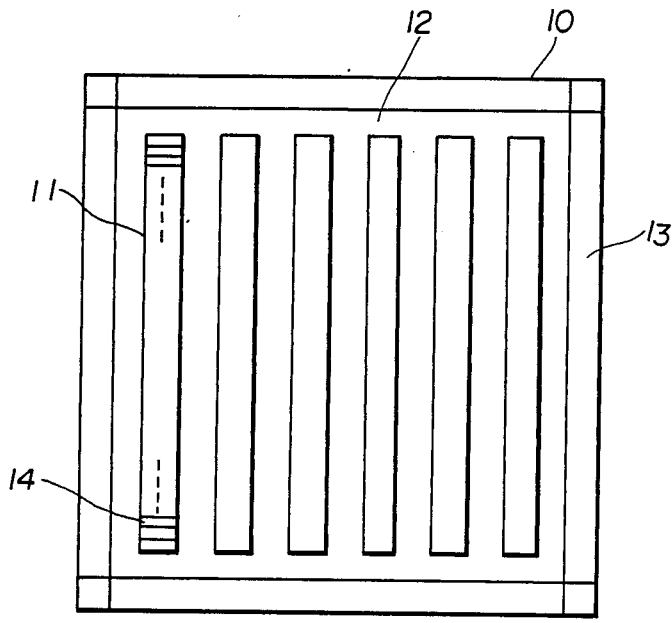
FIG. 1 is a plan view generally showing the conventional gate array.
Figure 2:
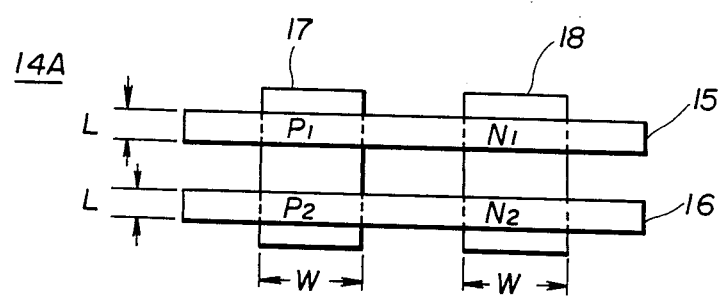
FIG. 2 is a plan view showing an example of the structure of a basic cell of the gate array shown in FIG. 1.
Figure 3:
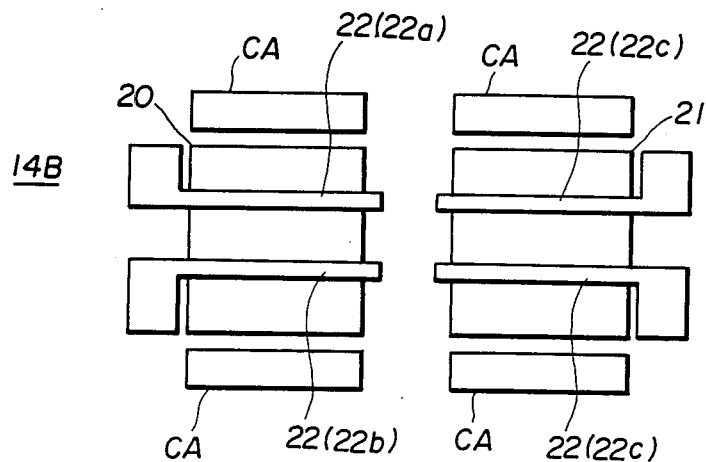
FIG. 3 is a plan view showing a conceivable structure of a basic cell of the gate array shown in FIG. 1.
Figure 8:
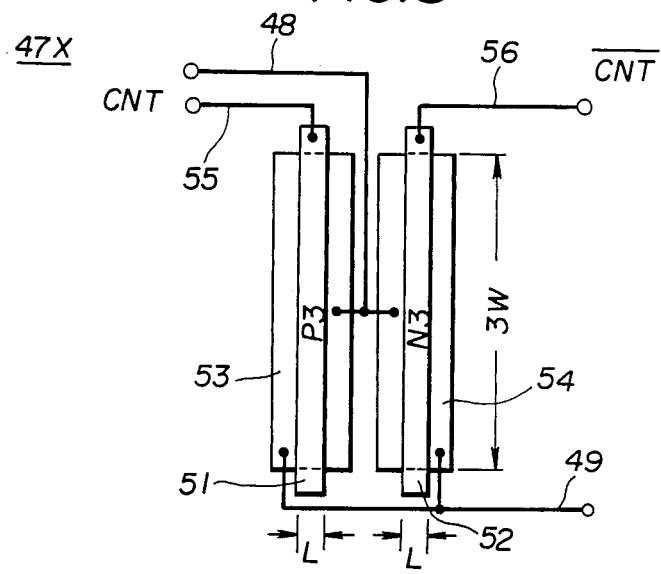
FIG. 8 is a plan view showing a transmission gate formed in the first embodiment of the gate array.

FIG. 8 is a plan view showing a transmission gate formed in the first embodiment of the gate array. Each specific cell 47 including the specific cell 47X comprises a p-channel transistor P3 and an n-channel transistor N3 which are respectively constituted by gate electrodes 51 and 52 extending parallel to the basic cell column 41, a p-type diffusion region 53 and an n-type diffusion region 54. Since the gate electrodes 51 and 52 extend parallel to the basic cell column 41, the p-channel transistor P3 and the n-channel transistor N3 can have a channel width 3W which is three times the channel width W of the p-channel and n-channel transistors shown in FIG. 2, for example. In other words, the channel width of the p-channel transistor P3 and the n-channel transistor N3 can be made considerably large compared to that of the conventional gate array. The channel length of the transistors P3 and N3 is denoted by L.

Figure 4:
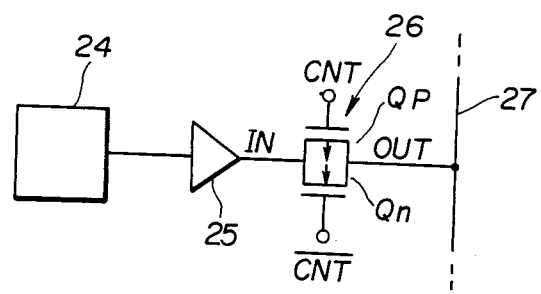
FIG. 4 shows the structure of a bus driver.

The p-type diffusion region 53 and the n-type diffusion region 54 are connected by the interconnections 48 and 49 which are made of a metal such as aluminum (Al). These interconnections 48 and 49 connect to the basic cells 44X and 44 as described before in conjunction with FIG. 7. In addition, the gate electrode 51 is connected to a signal source (not shown) which supplies the control signal $\overline{CNT}$ by way of a metal interconnection 55 while the gate electrode 52 is connected to a signal source (not shown) which supplies the control signal $\overline{CNT}$ by way of a metal interconnection 56. Hence, the transmission gate shown in FIG. 8 constituted by the specific cells 47 buried in the predetermined interconnection region 42S is equivalent to the transmission gate 26 described before in conjunction with FIG. 4.

When the specific cells 47 buried in the predetermined interconnection region 42S are not used, the predetermined interconnection region 42S may be used similarly as in the case of the ordinary interconnection region 42. Hence, the specific cells 47 may be buried in arbitrary one or ones of the interconnection regions 42, and it is possible to selectively use the buried specific cells 47 according to the needs. It is of course possible to bury the specific cells 47 in all of the interconnection regions 42. Furthermore, even when the specific cells 47 buried in the predetermined interconnection region 42S are used, it is still possible to use this predetermined interconnection region 42S similarly as in the case of the ordinary interconnection region 42.

According to the first embodiment, it is unnecessary to use a large number of the basic cells when constituting the transmission gate because the buried p-channel and n-channel transistors in the predetermined interconnection region may be used to constitute the transmission gate. Therefore, there will be no ineffective unused transistors in the basic cells, and the number of basic cells required to constitute the bus driver is reduced to one-half or less compared to that required in the conventional gate array. In addition, the utilization efficiencies of the basic cells and the interconnection regions are improved, thereby improving the utilization efficiency of the chip area.

Next, a description will be given on a second embodiment of the gate array according to the present invention. In the present embodiment, the general arrangement of the buried specific cells are the same as that of the first embodiment, and for this reason, the description will be given with reference to FIG. 6.

Figure 9:
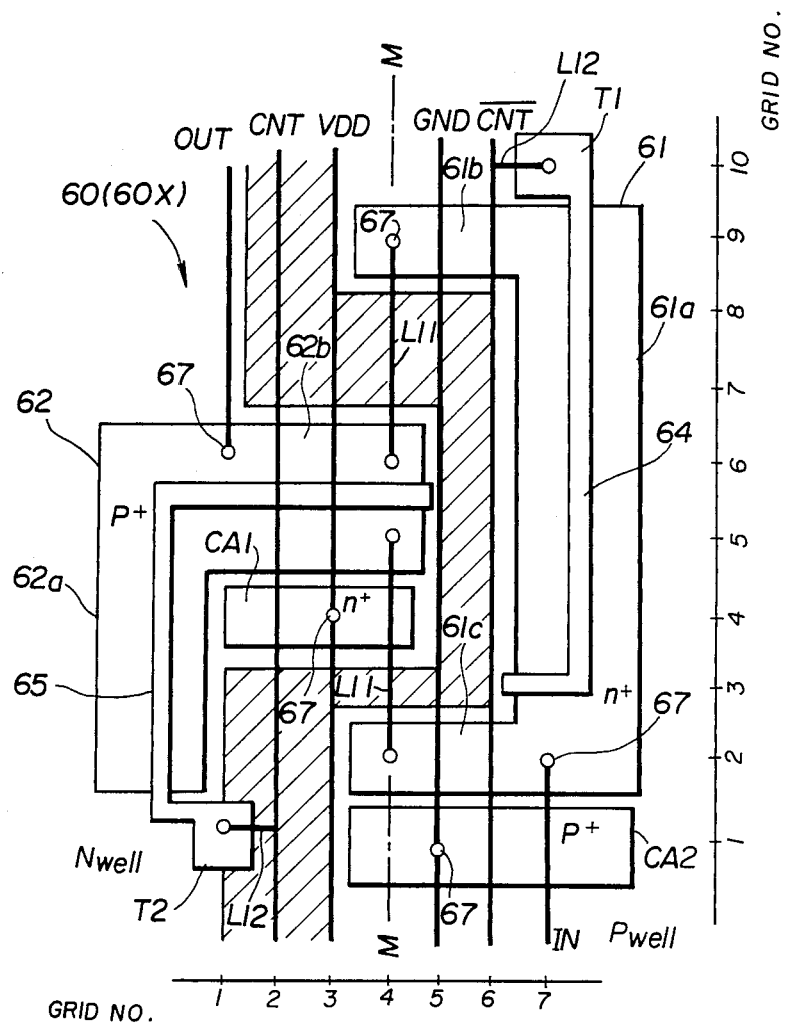
FIG. 9 shows the internal connections for constituting a transmission gate by the basic cells in a second embodiment of the gate array according to the present invention.

FIG. 9 shows the internal connections for constituting a transmission gate by the buried specific cells in the second embodiment of the gate array according to the present invention. In a transmission gate cell 60 shown in FIG. 9, an n-type source/drain region 61 comprising an n-type diffusion layer and a p-type source/drain region 62 comprising a p-type diffusion layer, for example, are formed to confront each other generally about the grid number "4" running parallel to the basic cell column 41. For convenience' sake, it will be assumed that the grid number "4" which runs parallel to the basic cell column 41 coincides with a center line M—M between two mutually adjacent basic cell columns 41 on both sides of the predetermined interconnection region 42S in which the transmission gate cell 60 is buried. In other words, the requirement is that a large portion of the n-type source/drain region 61 and a large portion of the p-type source/drain region 62 are located on respective sides of the center line M—M.

The n-type source/drain region 61 comprises a first portion 61a extending parallel to the basic cell column 41 and second portions 61b and 61c extending in a direction intersecting the center line M—M (that is, the grid number "4" running parallel to the basic cell column 41) from both ends of the first portion 61a.

A first gate electrode 64 is provided on the n-type source/drain region 61. This first gate electrode 64 extends parallel to the basic cell column 41 and approximately divides the first portion 61a into two parts. One end of the first gate electrode 64 extends beyond the first portion 61a, to form a terminal T1, while the other end of the first gate electrode 64 extends beyond the first portion 61a and toward the center line M—M. Hence, an n-channel transistor is constituted by the n-type source/drain region 61 and the first gate electrode 64. The width of the terminal T1 is extended to intersect the grid number "7" running parallel to the basic cell column 41.

On the other hand, the p-type source/drain region 62 comprises a first portion 62a extending parallel to the basic cell column 41 and a second portion 62b extending from one end of the first portion 62a so as to intersect the center line M—M (that is, the grid number "4" running parallel to the basic cell column 41) between the second portions 61b and 61c of the n-type source/drain region 61.

A second gate electrode 65 is provided on the p-type source/drain region 62. This second gate electrode 65 extends parallel to the basic cell column 41 and approximately divides the first portion 62a into two parts. One end of the second gate electrode 65 extends beyond the first portion 62a to form a terminal T2, while the other end of the second gate electrode 65 extends along the second portion 62b. This other end of the second gate electrode 65 extends beyond the second portion 62b and toward the center line M—M. Hence, a p-channel transistor is constituted by the p-type source/drain region 62 and the second gate electrode 65. The width of the terminal T2 is extended to intersect the grid number "1" running parallel to the basic cell column 41.

Furthermore, an n-type contact region CA1 provided between the second portion 61c of the n-type source/drain region 61 and the second portion 62b of the p-type source/drain region 62 is connected to an interconnection $V_{DD}$. A p-type contact region CA2 is connected to an interconnection GND. These contact regions CA1 and CA2 are provided to fix the potentials of the respective wells in which the source and drain regions of the n-channel and p-channel transistors are formed.

In other words, the n-type source-drain region 61 of the n-channel transistor is formed in a p-type well $P_{well}$, and the source and the contact region CA2 are connected in common to the ground GND. The n-channel transistor is driven by applying an appropriate positive voltage across the gate and drain. When the contact region CA2 is grounded, the potential of the p-type well $P_{well}$ is fixed to the ground voltage GND and helps the n-channel transistor operate stably. On the other hand, the p-type source/drain region 62 of the p-channel transistor is similarly formed in an n-type well $N_{well}$, and the source and contact region CA1 are connected in common to the power source voltage $V_{DD}$. When the contact region CA1 is connected to the voltage $V_{DD}$, the potential of the n-type well $N_{well}$ is fixed to $V_{DD}$ and helps the p-channel transistor to operate stably.

The p-channel transistor and the n-channel transistor are connected by the interconnection indicated by a bold line in FIG. 9. In FIG. 9, circular marks indicate contact holes 67 for making connections between the interconnection and the transistors.

Therefore, the interconnections $V_{DD}$ and GND are required in the transmission gate to fix the potential of the contact regions CA1 and CA2, and conventionally, the necessity to provide these interconnections $V_{DD}$ and GND would make the connections complex. However, in FIG. 9, the interconnections $V_{DD}$ and GND for the power source voltages are respectively arranged on the grid numbers "3" and "5" running parallel to the basic cell column 41 at the central portion of the transmission gate cell 60. In addition, control signal lines CNT and $\overline{CNT}$ are respectively arranged on the grid numbers "2" and "6" running parallel to the basic cell column 41, and connect to respective terminals T1 and T2 through interconnections L12. Furthermore, signal lines IN and OUT respectively connect to the n-type source/drain region 61 and the p-type source/drain region 62 through the contact holes 67 arranged on the grid numbers "1" and "7" running parallel to the basic cell column 41. Hence, no interconnection intersects within the transmission gate cell 60, and the interconnections are compact.

It may be also seen from FIG. 9 that an interconnection L11 for connecting the p-channel and n-channel transistors is only arranged on the grid number "4" which runs parallel to the basic cell column 41. Although the interconnections L12 are arranged between the grid numbers "1" and "2" and between the grid numbers "6" and "7" which run parallel to the basic cell column 41 so as to connect the control signal lines CNT and $\overline{CNT}$ to the respective terminals T1 and T2 through the contact holes arranged on the grid numbers "1" and "7" running parallel to the basic cell column 41, these interconnections L12 do not intersect other interconnections.

Accordingly, the interconnections connecting to the transmission gate cell 60 can be formed in a single level at least within the transmission gate cell 60. These interconnections formed in the single level can be connected outside the transmission gate cell 60 to an upper interconnection (not shown) according to the needs. In other words, according to the present embodiment, no multilevel interconnection is required since the interconnections are arranged so as not to intersect each other.

In addition, because the transmission gate is constituted by the specific cell 47 buried in the chip 40 within the predetermined interconnection region 42S, the chip area is utilized efficiently.

Figure 5:
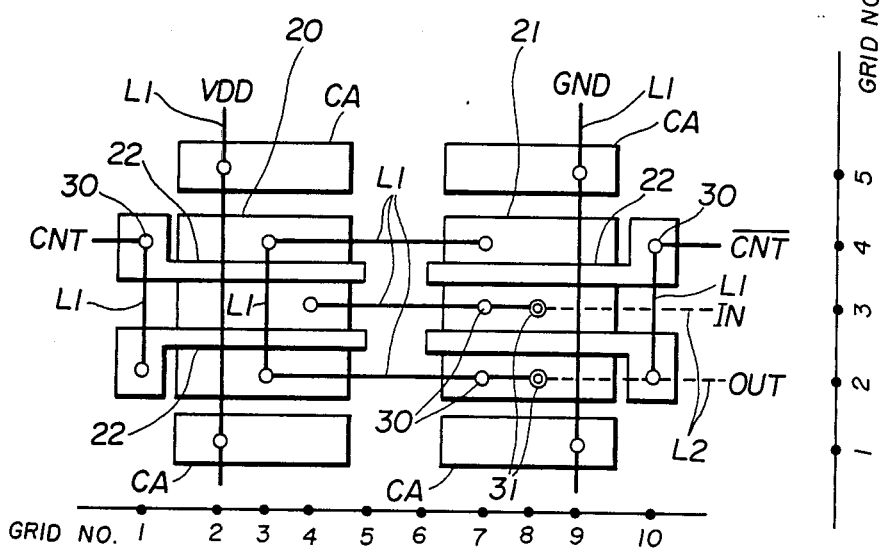
FIG. 5 shows an example of the conceivable internal connections for constituting a transmission gate by the basic cells.

When the width of the transmission gate cell 60 shown in FIG. 9 and the width of the conceivable transmission gate shown in FIG. 5 along the direction parallel to the basic cell column 41 are compared, a ratio between the two widths is 7:10, for example, and it can be seen that the number of grids over which the transmission gate cell 60 is arranged in the direction parallel to the basic cell column 41 is reduced compared to the conceivable transmission gate. Further, according to the transmission gate cell 60, the p-channel and n-channel transistors are separated by one or more grid intervals thereby ensuring a sufficient element isolation. In FIG. 9, an element isolation region is indicated by hatchings.

According to the present embodiment, the channel width of the p-channel and n-channel transistors amounts to eight or nine grid intervals in the direction parallel to the basic cell column 41. When it is assumed that the grid pitch is 5 $\mu$m, the channel width is in the order of 50 $\mu$m which is sufficiently large for use in the transmission gate of the bus driver.

Figure 10:
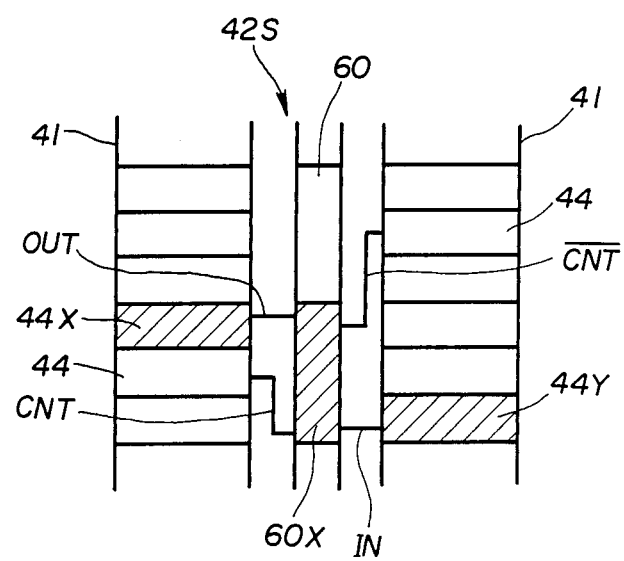
FIG. 10 is a plan view showing on a large scale a specific cell and portions of basic cell columns in vicinities thereof in the second embodiment.

FIG. 10 shows the arrangement of the transmission gate cell 60 on the chip 40. A plurality of the transmission gate cells 60 having the internal interconnections shown in FIG. 9 are provided in the predetermined interconnection region 42S according to the needs. A specific transmission gate cell 60X connects to the predetermined basic cell 44X of one basic cell column 41 through the signal line OUT and connects to a predetermined basic cell 60Y of an adjacent basic cell column 41 through a signal line IN. Furthermore, the specific transmission gate cell 60X also connects to the basic cells 44 of the two adjacent basic cell columns 41 through the lines CNT and $\overline{\text{CNT}}$. The lines IN, OUT, CNT and $\overline{\text{CNT}}$ are formed on the same level as the internal interconnections of the specific transmission gate cell 60X, but it is of course possible to use two levels to form these lines according to the needs.

Therefore, according to the present embodiment, the transmission gate can be formed by use of interconnections formed in a single level, and it is possible to increase the degree of freedom with which the basic circuit blocks and mutual connections thereof are designed. For this reason, it is possible to simplify the production process of an integrated circuit using the gate array.

Further, the present invention is not limited to these embodiments, but various variations and modifications may be made without departing from the scope of the present invention.

What is claimed is:

1. A gate array comprising:
   a semiconductor substrate;
   a plurality of mutually parallel basic cell columns including a plurality of basic cells formed on said semiconductor substrate, each of said basic cells comprising a pair of a first p-channel transistor and a first n-channel transistor;
   a plurality of interconnection regions each formed between two mutually adjacent ones of said basic cell columns; and
   specific cells buried in one of a plurality of predetermined ones of said interconnection regions, each of said specific cells comprising at least a second p-channel transistor and a second n-channel transistor forming a transmission gate, said second n-channel transistor having an n-type source/drain region and a first gate electrode, said second p-channel transistor having a p-type source/drain region and a second gate electrode, said n-type source/drain region having a first portion extending parallel to said basic cell columns and a second portion extending in a direction perpendicular to said basic cell columns from one end of said first portion, said p-type source/drain region having a third portion extending parallel to said basic cell columns and a fourth portion extending in a direction perpendicular to said basic cell columns from one end of said third portion, said n-type source/drain region and said p-type source/drain region substantially confronting each other in a central portion of said specific cell so that a large portion of said n-type source/drain region and a large portion of said p-type source/drain region are respectively sectioned by a center line of said specific cell parallel to said basic cell columns, said first and second gate electrodes extending parallel to said basic cell columns.

2. A gate array as claimed in claim 1, wherein said basic cells have an elongated shape extending generally in a predetermined direction perpendicular to said basic cell columns, and said specific cells having an elongated shape extending generally in a direction parallel to said basic cell columns.

3. A gate array as claimed in claim 1, wherein said second p-channel transistor and said second n-channel transistor of said specific cells each have a gate extending parallel to said basic cell columns, said gate having a channel width-to-length ratio which is greater than or equal to two times a channel width-to-length ratio of gates of said first p-channel transistors and said first n-channel transistors of said basic cells.

4. A gate array as claimed in claim 1, further comprising a plurality of cells provided on a peripheral portion of said semiconductor substrate for forming an interface between an external circuit and the cells formed on said semiconductor substrate.

5. A gate array as claimed in claim 1, further comprising an interconnection for making internal connections within said specific cell and interconnections for power source voltages respectively arranged in a central portion of said specific cell, said interconnections for the power source voltages being parallel to said basic cell columns.

6. A gate array as claimed in claim 5, wherein said interconnections are provided in a single level.

7. A gate array comprising:
   a semiconductor substrate;
   a plurality of mutually parallel basic cell columns each including a plurality of basic cells formed on said semiconductor substrate, each of said basic cells including a pair of a first p-channel transistor and a first n-channel transistor;
   a plurality of interconnection regions each formed between two mutually adjacent ones of said basic cell columns; and
   specific cells buried in one of a plurality of predetermined ones of said interconnection regions, each of said specific cells including at least a second p- channel transistor and a second n-channel transistor forming a transmission gate, said n-channel transistor including an n-type source/drain region and a first gate electrode and said second p-channel transistor including a p-type source/drain region and a second gate electrode, said p-type source/drain region and said n-type source/drain region substantially confronting each other in a central portion of said specific cell so that a large portion of said p-type source/drain region and a large portion of said n-type source/drain region are respectfully sectioned by a center line of said specific cell parallel to said basic cell column, said n-type source/drain region including a first portion extending parallel to said basic cell columns and a pair of second portions extending in a direction intersecting the center line form both ends of the first portion, and said p-type source/drain region including a third portion extending parallel to said basic cell columns and a fourth portion extending from one end of said third portion so as to intersect the center line between the second portions of said n-type source/drain region.

8. A gate array as claimed in claim 7, wherein said first gate electrode being provided on said n-type source/drain region and extending parallel to said basic cell columns to approximately divide said first portion into two parts, and said second gate electrode being provided on said p-type source/drain region and extending parallel to said basic cell columns to approximately divide said third portion into two parts.

9. A gate array as claimed in claim 7, further comprising a contact region provided between said second portion of said n-type source/drain region and said fourth portion of said p-type source/drain region, and interconnections for supplying power source voltages running parallel to said basic cell columns, said contact region being connected to one of said interconnections.

10. A gate array as claimed in claim 7, further comprising an interconnection for connecting one of said pair of second portions of said n-type source/drain region and said fourth portion of said p-type source/drain region and an interconnection for connecting the other one of said second portions of said n-type source/drain region and said fourth portion of said p-type source/drain region, said interconnections lie on a single level parallel to said basic cell columns.

11. A gate array as claimed in claim 1, further comprising an interconnection for making internal connections within said specific cell and interconnections for power source voltages respectively arranged in a central portion of said specific cell, said interconnections for the power source voltages running parallel to said basic cell columns.

12. A gate array as claimed in claim 11, wherein said interconnections are provided in a single level.

13. A gate array as set forth in claim 7, wherein said basic cells have an elongated shape extending substantially in a predetermined direction perpendicular to said basic cell columns, and wherein said specific cells have an elongated shape extending substantially in a direction parallel to said basic cell columns.

14. A gate array as set forth in claim 7, wherein each said second p-channel transistor and said second n-channel transistor of said specific cells has a gate extending parallel to said basic cell columns, said gate having a channel width-to-length ratio which is greater than or equal to two times a channel width-to-length ratio of gates of said first p-channel transistor and said first n-channel transistors of said basic cells.

15. A gate array as set forth in claim 7, further comprising a plurality of cells provided on a peripheral portion of said semiconductor substrate for forming an interface between an external circuit and the cells formed on said semiconductor substrate.

16. A gate array as set forth in claim 7, further comprising an interconnection for making internal connections within said specific cells and for power source voltages, respectively, arranged in a central portion of said specific cell, said interconnection for the power source voltages being parallel to said basic cell columns.

17. A gate array as set forth in claim 16, wherein said interconnections are provided in a single level.

* * * * *